United States Patent
Ou

(10) Patent No.: US 9,111,586 B2
(45) Date of Patent: Aug. 18, 2015

(54) STORAGE MEDIUM AND TRANSMITTAL SYSTEM UTILIZING THE SAME

(71) Applicant: Silicon Motion, Inc., Jhubei (TW)

(72) Inventor: Hsu-Ping Ou, Zhubei (TW)

(73) Assignee: Silicon Motion, Inc., Jhubei (TW)

( * ) Notice: Subject to any disclaimer, the term of this patent is extended or adjusted under 35 U.S.C. 154(b) by 177 days.

(21) Appl. No.: 13/917,007

(22) Filed: Jun. 13, 2013

(65) Prior Publication Data

US 2014/0036603 A1    Feb. 6, 2014

(30) Foreign Application Priority Data

Jul. 31, 2012  (TW) .............................. 101127562 A

(51) Int. Cl.

| | | |
|---|---|---|
| *G11C 29/00* | (2006.01) | |
| *G11C 7/00* | (2006.01) | |
| *G11C 29/08* | (2006.01) | |
| *G11C 29/16* | (2006.01) | |
| *G11C 29/38* | (2006.01) | |
| G11C 29/04 | (2006.01) | |
| G11C 29/12 | (2006.01) | |
| G11C 29/26 | (2006.01) | |

(52) U.S. Cl.
CPC ........ *G11C 7/00* (2013.01); *G11C 29/08* (2013.01); *G11C 29/16* (2013.01); *G11C 29/38* (2013.01); *G11C 2029/0405* (2013.01); *G11C 2029/1208* (2013.01); *G11C 2029/2602* (2013.01)

(58) Field of Classification Search
USPC ................. 365/201, 189.011; 714/5, 6, 8, 30
See application file for complete search history.

(56) References Cited

U.S. PATENT DOCUMENTS

| | | | |
|---|---|---|---|
| 7,334,159 B1* | 2/2008 | Callaghan ....................... 714/30 |
| 2006/0190788 A1* | 8/2006 | Jasinski et al. ................ 714/733 |
| 2010/0156648 A1* | 6/2010 | Dosaka et al. ................ 340/635 |

* cited by examiner

*Primary Examiner* — Vu Le

(74) *Attorney, Agent, or Firm* — Wang Law Firm, Inc.; Li K. Wang; Stephen Hsu

(57) ABSTRACT

A storage medium including a processing module and a cell array. The processing module receives test data according to a write command. The cell array stores the test data. The processing module receives verify data according to a comparison command, reads the test data stored in the cell array to generate access data, and compares the access data with the verify data to generate a compared report.

17 Claims, 6 Drawing Sheets

US 9,111,586 B2

STORAGE MEDIUM AND TRANSMITTAL SYSTEM UTILIZING THE SAME

CROSS REFERENCE TO RELATED APPLICATIONS

This Application claims priority of Taiwan Patent Application No. 101127562, filed on Jul. 31, 2012, the entirety of which is incorporated by reference herein.

BACKGROUND OF THE INVENTION

1. Field of the Invention

The invention relates to a storage medium, and more particularly to a storage medium with a comparison function.

2. Description of the Related Art

A storage medium is a general electronic device and utilized to store data. The storage medium comprises volatile memories and non-volatile memories. The volatile memories comprise dynamic random access memories (DRAMs) and static random access memories (SRAMs). The non-volatile memories comprise read-only memories (ROMs), programmable read-only memories (PROMs), erasable programmable read-only memories (EPROMs), electrically erasable programmable read-only memories (EEPROMs), and flash memories.

Generally, during the testing of a storage medium, a tester sores data in the storage medium, retrieves the data that has been stored in the storage medium, and then determines whether the retrieved data is equal to the original data. However, the storage medium needs a long time to output the stored data. Thus, the time required for testing is increased.

BRIEF SUMMARY OF THE INVENTION

In accordance with an embodiment, a storage medium comprises a processing module and a cell array. The processing module receives test data according to a write command. The cell array stores the test data. The processing module receives verify data according to a comparison command, reads the test data stored in the cell array to generate access data, and compares the access data with the verify data to generate a compared report.

In accordance with another embodiment, a transmittal system comprises a memory controller and a storage medium. The memory controller sends at least one write command and at least one comparison command. The storage medium comprises a processing module and a cell array. The processing module receives test data according to the write command. The cell array stores the test data. The processing module receives verify data according to the comparison command, reads the test data stored in the cell array to generate access data, and compares the access data with the verify data to generate a compared report.

In accordance with a further embodiment, a control method for a storage medium comprises storing test data; receiving verify data; reading the stored test data to generate access data; and comparing the access data and the verify data to generate a compared report.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
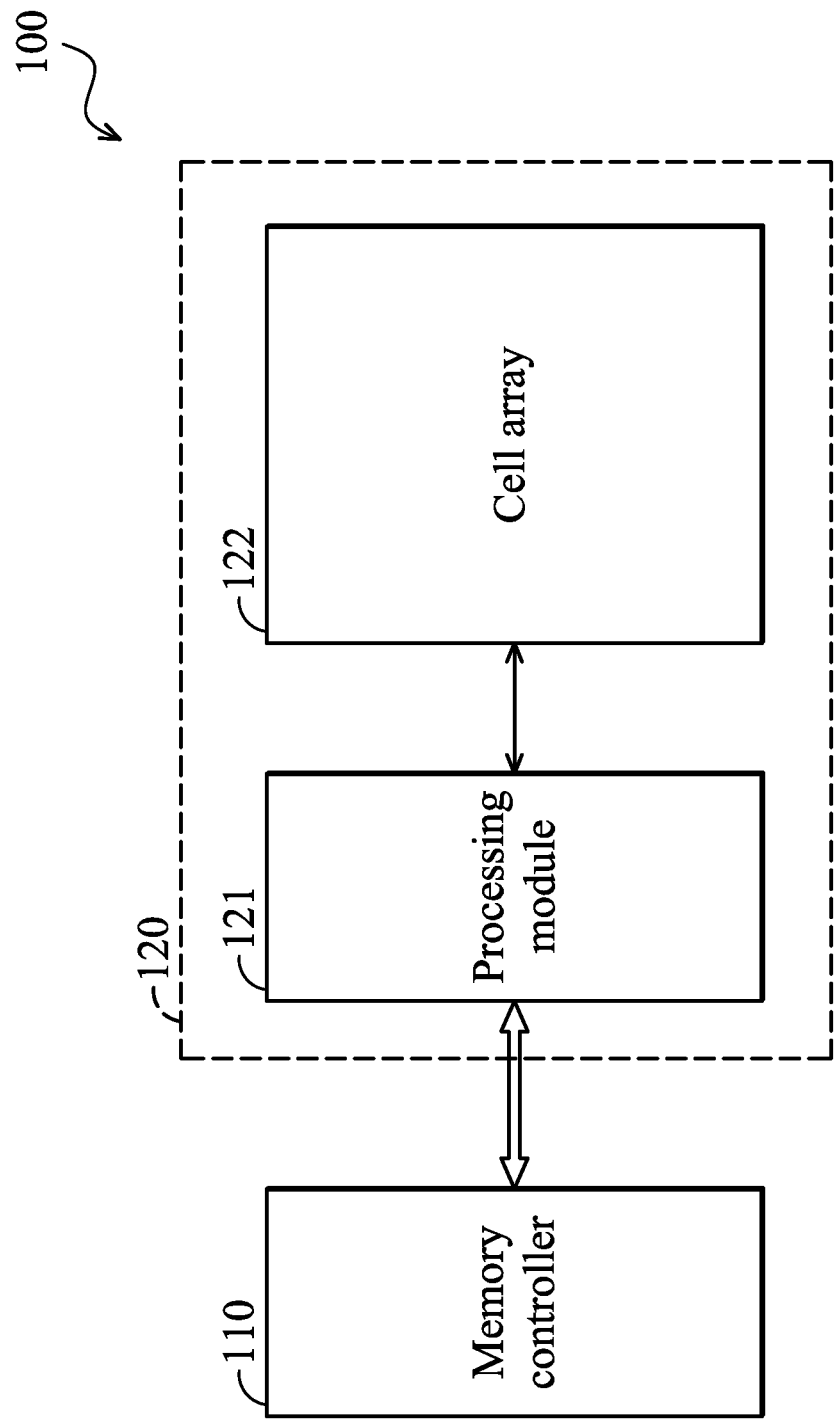
FIG. 1 is a schematic diagram of an exemplary embodiment of a transmittal system.

FIG. 1 is a schematic diagram of an exemplary embodiment of a transmittal system. The transmittal system 100 comprises a memory controller 110 and a storage medium 120. The memory controller 110 accesses the storage medium 120. In this embodiment, the storage medium 120 has an auto-comparing function to generate a compared report according to a compared result. The memory controller 110 determines whether the storage medium 120 is capable of accessing data according to the compared report.

For example, in a write mode, the memory controller 110 writes test data into the storage medium 120. In a verify mode, the memory controller 110 provides verify data to the storage medium 120. The storage medium 120 compares the verify data and the stored test data to generate a compared report. The memory controller 110 determines whether the storage medium 120 is capable of accessing data according to the compared report.

In this embodiment, the memory controller 110 sends at least one write command and at least one comparison command to control the storage medium 120 to execute at least one write action and at least one comparison action. The invention does not limit the sequence of sending the write command and the comparison command.

Assuming the memory controller 110 desires to send two write commands and two comparison commands to the storage medium 120, in one embodiment the memory controller 110 may alternatively send the write commands and the comparison commands. In other words, the memory controller 110 sequentially sends a first write command, a first comparison command, a second write command and a second comparison command. In other embodiments, the memory controller 110 first sends two write commands and then sends two comparison commands. In other words, the memory controller 110 sequentially sends a first write command, a second write command, a first comparison command and a second comparison command.

The storage medium 120 executes a specific action according to a sent command (e.g. a write command and a comparison command). The invention does not limit the kind of the storage medium 120. In one embodiment, the storage medium 120 is a NAND flash memory. As shown in FIG. 1, the storage medium 120 comprises a processing module 121 and a cell array 122.

Figure 2:
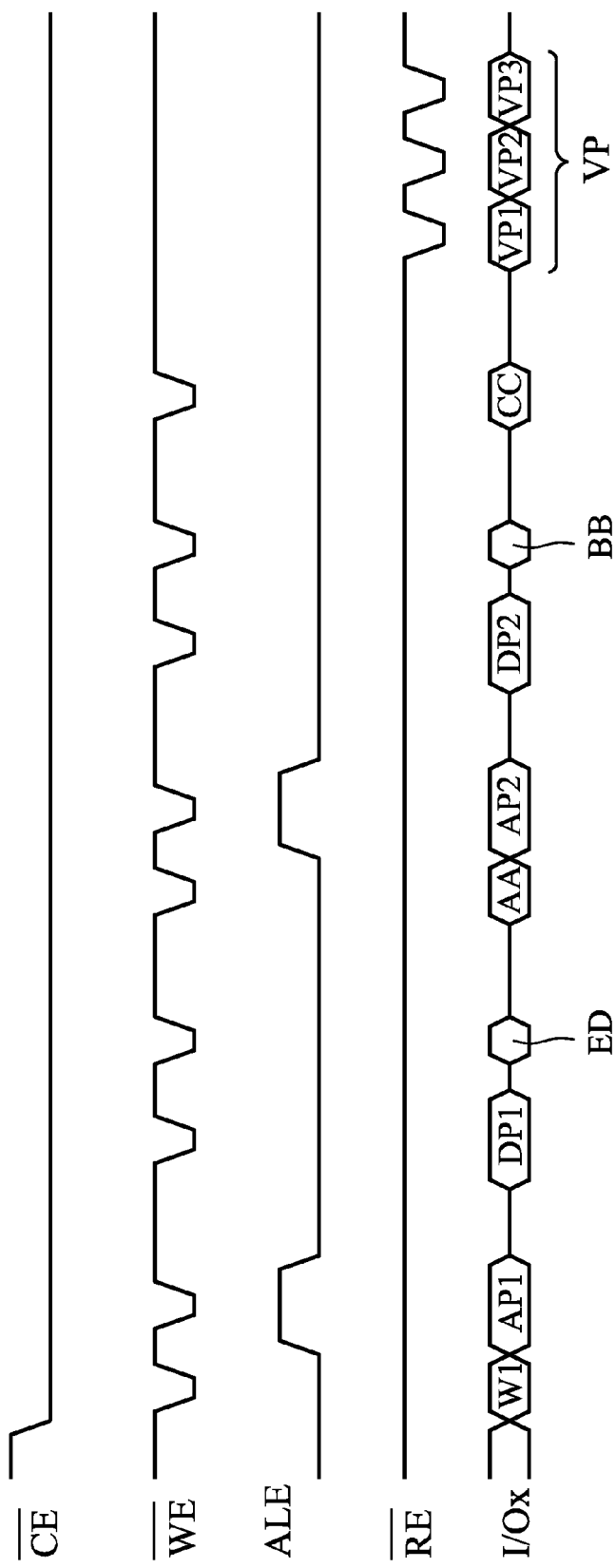
FIG. 2 is a control timing diagram for a storage medium.

The processing module 121 accesses the cell array 122 according to the commands sent from the memory controller 110. FIG. 2 is a control timing diagram for the storage medium 120. When a chip enable signal $\overline{CE}$ is at a low level, the processing module 121 is activated. When a write enable signal $\overline{WE}$ is at a low level, the processing module 121 receives information provided by the memory controller 110. When an address latch enable signal ALE is at a high level, the processing module 121 receives an address package (e.g. AP1 and AP2). When read enable signal $\overline{RE}$ is at a low level, the processing module 121 provides information to the memory controller 110. The symbol I/Ox represents a transmittal status between the processing module 121 and the memory controller 110.

When the memory controller 110 sends a write command W1, the processing module 121 enters a write mode. In the write mode, the processing module 121 receives an address package AP1 according to the address latch enable signal ALE and writes a data package DP1 (i.e. test data) into the cell array 122 according to the address package AP1. When the memory controller 110 sends an end command ED, the processing module 121 stops writing the data package into the cell array 122.

When the memory controller 110 sends a comparison command AA, the processing module 121 enters a verify mode. In the verify mode, the processing module 121 receives an address package AP2 according to the address latch enable signal ALE, retrieves the data stored in the cell array 122 according to the address package AP2, and receives a data package DP2. In this embodiment, the result retrieved by the processing module 121 is referred to as access data and the data package DP2 is referred to as verify data.

In this embodiment, the address package AP2 is equal to the address package AP1 and the data package DP2 is equal to the data package DP1. When the memory controller 110 sends an end command BB, the processing module 121 stops writing data into the cell array 122.

The processing module 121 compares the access data with the verify data to generate a compared report. Since the access data and the verify data have a plurality of bits, the processing module 121 compares the bits of the access data with the bits of the verify data, one by one.

For example, the processing module 121 first compares the first bit of the access data with the first bit of the verify data and then compares the second bit of the access data with the second bit of the verify data, until all bits of the access data and verify data have been compared.

During the comparison of access data with verify data, the processing module 121 records a number that represents a bit of access data not being equal to the bit of verify data with which it was compared, uses the recorded number as a compared report, and provides the compared report to the memory controller 110. In other embodiments, the processing module 121 records a number that the compared bit of the access data is 0 and the compared bit of the verify data is 1 and another number that the compared bit of the access data is 1 and the compared bit of the verify data is 0, for each comparison procedure.

When the memory controller 110 sends a read command CC, the processing module 121 provides the compared report to the memory controller 110 according to the read command CC. The memory controller 110 determines whether the storage medium 120 is capable of executing an access action according to the compared report.

The invention does not limit the method of determination. In one embodiment, when the compared report exceeds to a pre-determined value, the memory controller 110 determines that the storage medium 120 cannot execute the access action normally. When the compared report is less than the pre-determined value, the memory controller 110 determines that the storage medium 120 can execute the access action normally.

In this embodiment, the compared report VP shown in FIG. 2 provides three compared information comprising a number VP1 that the compared bit of the access data is not equal to the compared bit of the verify data, a number VP2 that the compared bit of the access data is 0 and the compared bit of the verify data is 1, and a number VP3 that the compared bit of the access data is 1 and the compared bit of the verify data is 0. In other embodiments, the compared report VP provides at least one of the above types of information.

Figure 3:
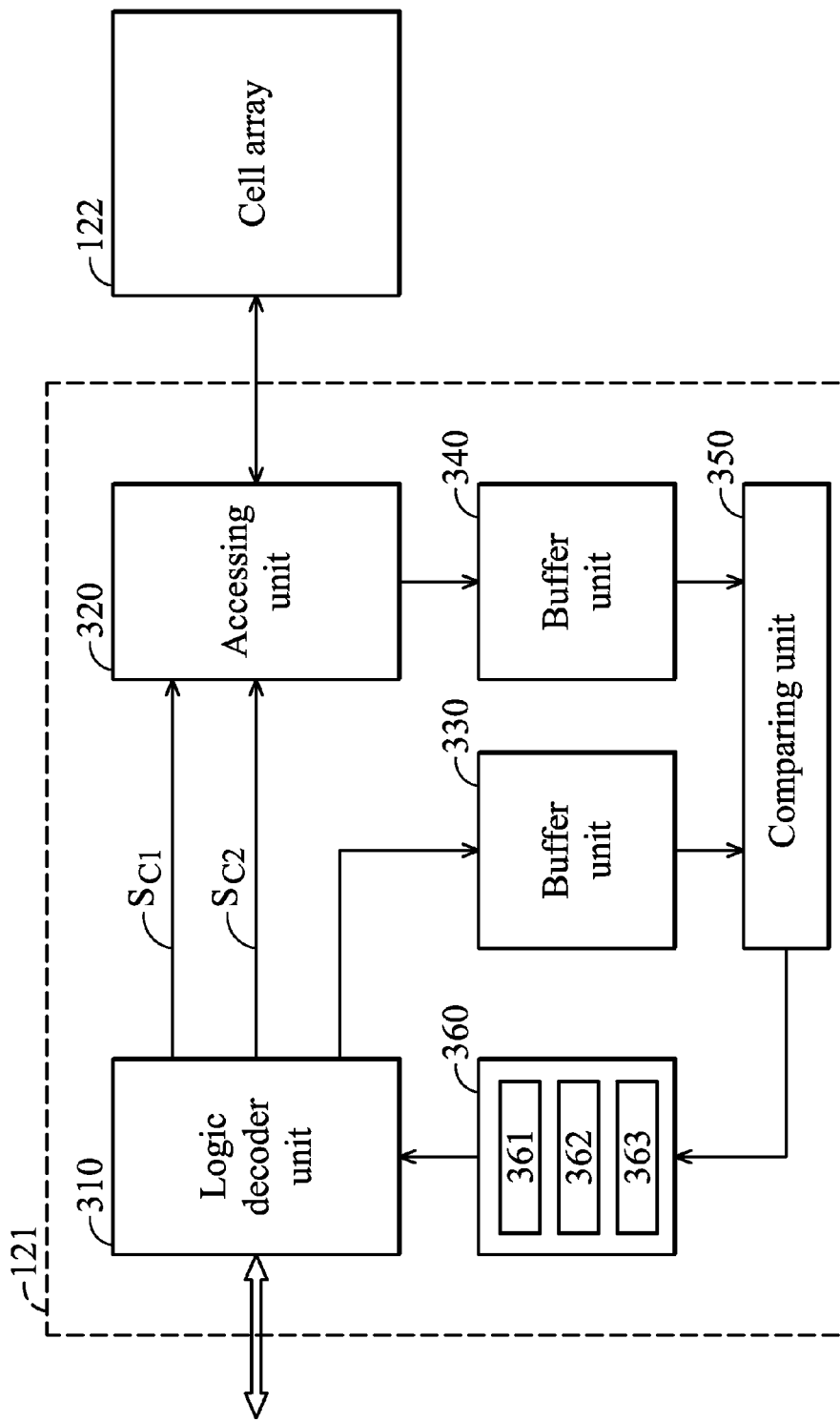
FIG. 3 is a schematic diagram of an exemplary embodiment of a processing module.

Additionally, the invention does not limit the circuit structure of the processing module 121. Any circuit can serve as the processing module, as long as the circuit is capable of executing the above functions. FIG. 3 is a schematic diagram of an exemplary embodiment of a processing module. In this embodiment, the processing module 121 comprises a logic decoder unit 310, an accessing unit 320, buffer units 330, 340, a comparing unit 350, and a register unit 360.

The logic decoder unit 310 decodes the commands sent from the memory controller 110. In one embodiment, the logic decoder unit 310 decodes the write command W1 and the comparison command AA to generate control signals $S_{C1}$ and $S_{C2}$, respectively. In this embodiment, after decoding the write command W1, the logic decoder unit 310 determines that the memory controller 110 desires to write data into the cell array 122. Thus, the logic decoder unit 310 generates the control signal $S_{C1}$ according to the address package AP1.

After decoding the comparison command AA, the logic decoder unit 310 determines that the memory controller 110 desires to compare the test data stored in the cell array 122 with the verify data. Thus, the logic decoder unit 310 generates the control signal $S_{C2}$ according to the address package AP2, receives the data package DP2 (i.e. verify data), and then stores the data package DP2 into the buffer unit 330.

The accessing unit 320 writes the test data (i.e. the data package DP1) into the cell array 122 according to the control signal $S_{C1}$ and retrieves the test data stored in the cell array 122 according to the control signal $S_{C2}$. In one embodiment, the accessing unit 320 stores the retrieved result (i.e. access data) into the buffer unit 340.

The comparing unit 350 compares the data stored in the buffer units 330 and 340 and stores the compared result into the register unit 360. When the logic decoder unit 310 receives a read command CC, the logic decoder unit 310 retrieves the compared result stored in the register unit 360 and provides the retrieved result to the memory controller 110.

In this embodiment, the access data stored in the buffer unit 330 comprises a plurality of bits and the verify data stored in the buffer unit 340 also comprises a plurality of bits. To generate a compared report, the comparing unit 350 compares the bits of the access data with the bits of the verify data, one by one.

The invention does not limit the circuit structure of the register unit 360. In this embodiment, the register unit 360 comprises accumulators 361~363. In other embodiments, the register unit 360 may comprise one or two accumulators. Additionally, the register unit 360 may be integrated in the logic decoder unit 310.

In this embodiment, each of the accumulators 361~363 has one count value to provide different compared information. For example, When the comparing unit 350 compares the access data with the verify data and the compared bit of the access data is not equal to the compared bit of the verify data, the count value of the accumulator 361 counts up by 1. When the compared bit of the access data is 0 and the compared bit of the verify data is 1, the count value of the accumulator 362 counts up by 1. When the compared bit of the access data is 1 and the compared bit of the verify data is 0, the count value of the accumulator 363 counts up by 1.

Figure 4:
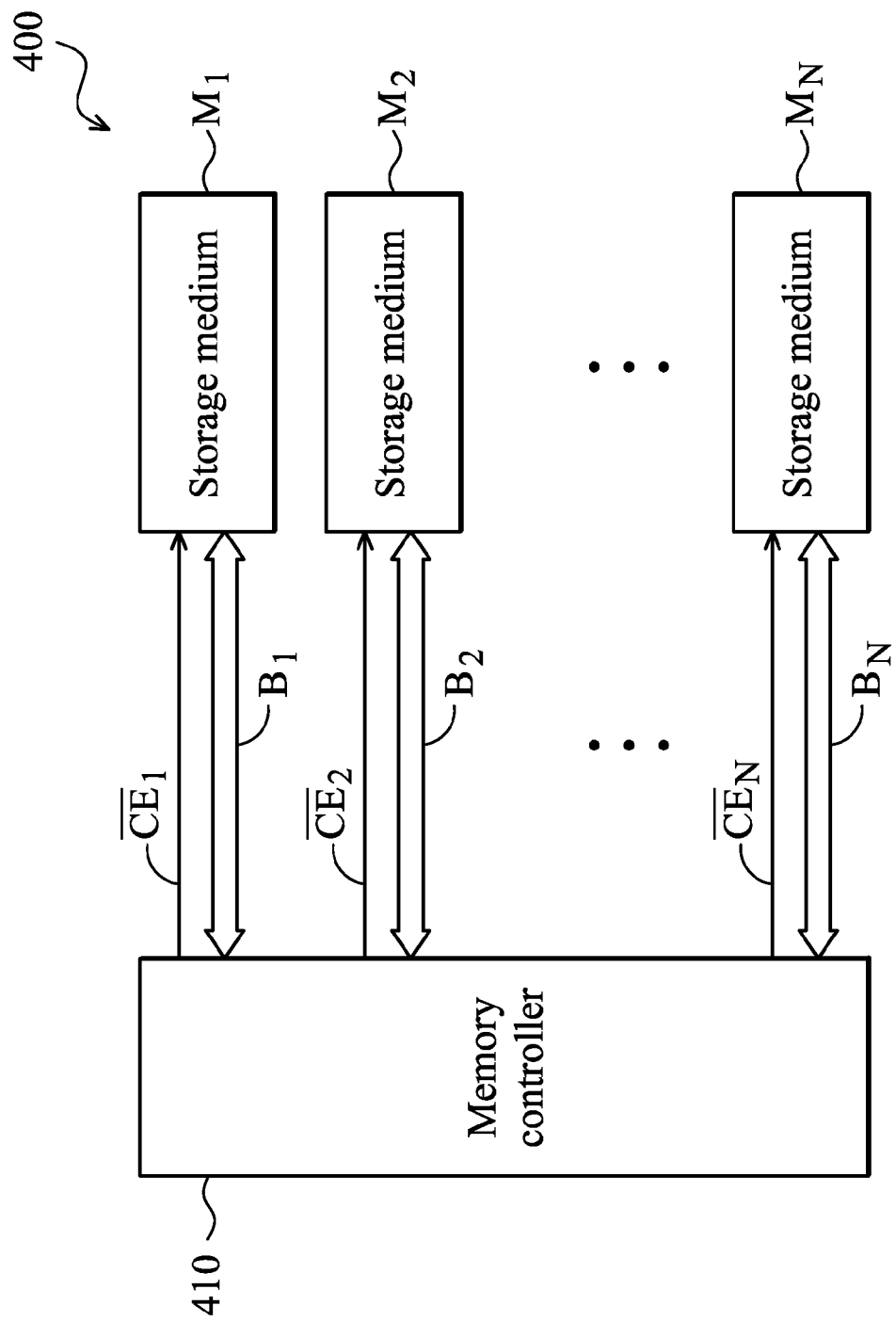
FIG. 4 is a schematic diagram of another exemplary embodiment of the transmittal system.

FIG. 4 is a schematic diagram of another exemplary embodiment of the transmittal system. FIG. 4 is similar to FIG. 1 with the exception that the transmittal system shown in FIG. 4 comprises a plurality of storage media $M_1$~$M_N$. The memory controller 410 provides chip enable signals $\overline{CE_1}$~$\overline{CE_N}$ to activate the storage media $M_1$~$M_N$ via different transmittal lines.

In this embodiment, the memory controller 410 communicates with storage media $M_1$~$M_N$ via buses $B_1$~$B_N$. Taking the storage medium $M_1$ as an example, the storage medium $M_1$ receives the control signals (e.g. $\overline{WE}$, ALE, $\overline{RE}$), the control commands (e.g. W1, ED, AA, BB, CC), the address packages (e.g. AP1, AP2) and the data packages (e.g. DP1, DP2) via the bus $B_1$. In addition, the storage medium $M_1$ can provide a compared report VP to the memory controller 410 via the bus $B_1$.

In one embodiment, the memory controller 410 executes verify actions for the storage media $M_1$~$M_N$ in succession. For example, the memory controller 410 first activates the storage medium $M_1$, writes test data into the storage medium $M_1$, provides verify data to the storage medium $M_1$ and receives a compared report provided by the storage medium $M_1$. After receiving the compared report provided by the storage medium $M_1$, the memory controller 410 accesses the storage medium $M_2$ to execute the verify action until the memory controller 410 receives all compared reports. Since the amount of data in the compared reports provided by the storage media $M_1$~$M_N$ is little, the memory controller 410 can quickly determine whether the storage media $M_1$~$M_N$ are normal.

In another embodiment, the memory controller 410 sends a plurality of write commands, a plurality of comparison commands, and a plurality of read commands. For example, the memory controller 410 sequentially or non-sequentially sends the write commands to the storage media $M_1$~$M_N$, sequentially or non-sequentially sends the comparison commands to the storage media $M_1$~$M_N$ to provide the verify data to the storage media $M_1$~$M_N$, and sequentially or non-sequentially sends the read commands to the storage media $M_1$~$M_N$ to receive the compared reports provided by the storage media $M_1$~$M_N$.

Figure 5:
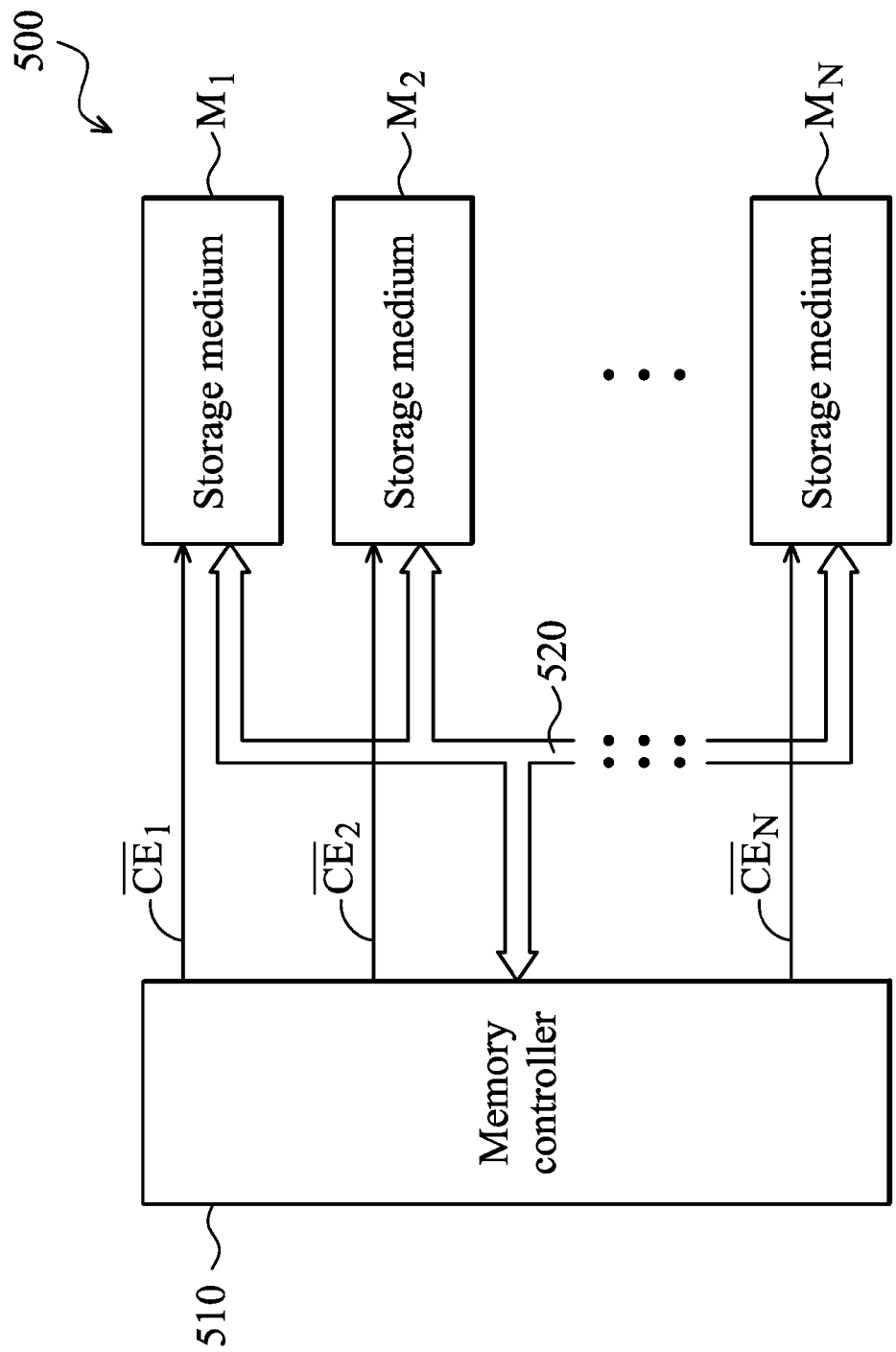
FIG. 5 is a schematic diagram of another exemplary embodiment of the transmittal system.

FIG. 5 is a schematic diagram of another exemplary embodiment of the transmittal system. FIG. 5 is similar to FIG. 4 with the exception that the memory controller 510 communicates with the storage media $M_1$~$M_N$ via a single bus 520. In this embodiment, the memory controller 510 simultaneously writes data into the storage media $M_1$~$M_N$ and sequentially or non-sequentially reads the compared reports provided by the storage media $M_1$~$M_N$.

The invention does not limit how the memory controller 510 provides the verify data to the storage media $M_1$~$M_N$. In one embodiment, the memory controller 510 provides the verify data to the storage media $M_1$~$M_N$ simultaneously and sequentially receives the compared reports provided by the storage media $M_1$~$M_N$.

In other embodiments, the memory controller 510 sequentially provides the verify data to the storage media $M_1$~$M_N$. However, the memory controller 510 receives a compared report provided by one of the storage media $M_1$~$M_N$ after the memory controller 510 provides the verify data to the corresponding storage medium. For example, the memory controller 510 first provides the verify data to the storage medium $M_1$, then receives the compared report provided by the storage medium $M_1$, then provides the verify data to the storage medium $M_2$, and receives the compared report provided by the storage medium $M_2$.

Figure 6:
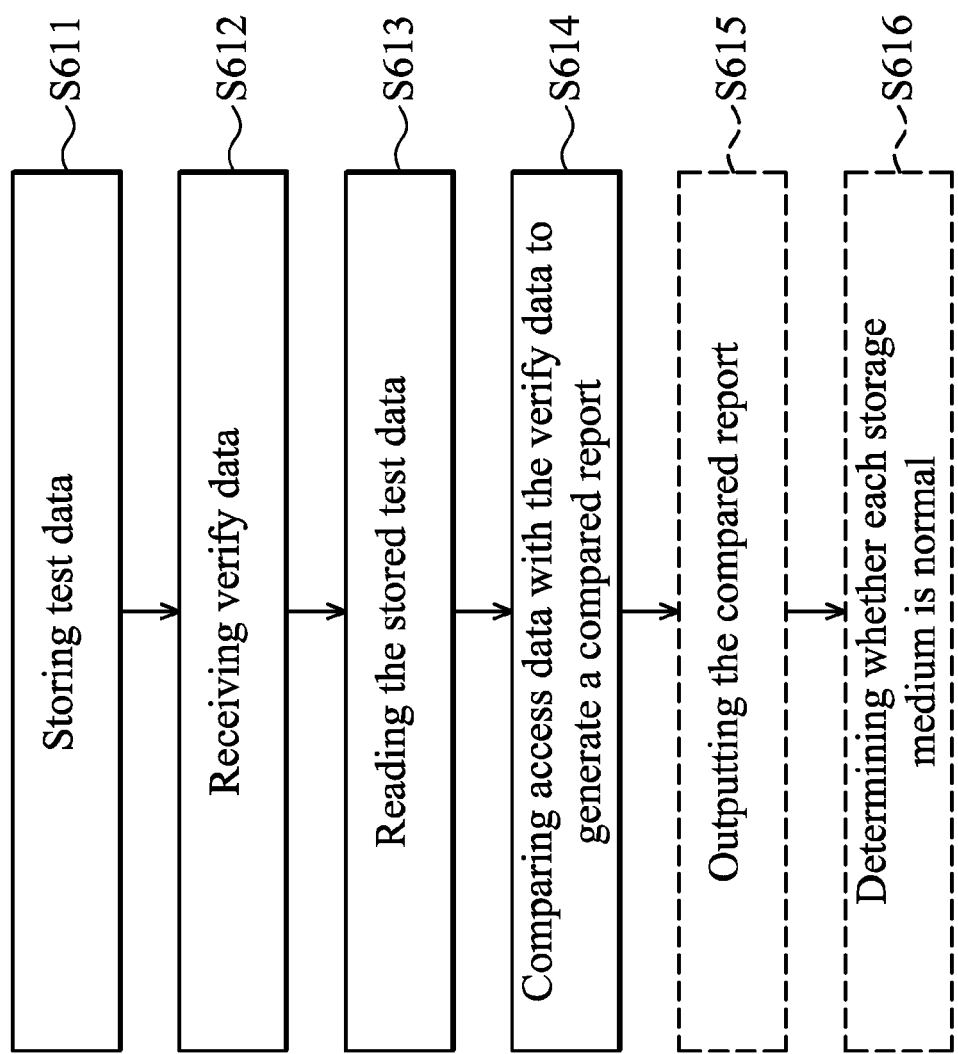
FIG. 6 is a flowchart of another exemplary embodiment of a control method for a storage medium.

FIG. 6 is a flowchart of another exemplary embodiment of a control method for storage media. First, test data is stored (step S611). In one embodiment, the test data is simultaneously stored into the storage media. In other embodiments, the test data is sequentially stored into the storage media.

Verify data is received (step S612). In this embodiment, the verify data is equal to the test data to determine whether the storage media can store the test data normally. Additionally, the verify data can simultaneously or sequentially be stored in the storage media.

The stored test data is read (step S613). In this embodiment, the read result serves as access data. Then, the access data is compared with the verify data to generate a compared report (step S614). In this embodiment, step S614 compares all bits of the access data and all bits of the verify data one by one. For example, step S614 first compares the first bit of the access data with the first bit of the verify data and then compares the second bit of the access data with the second bit of the verify data until all bits are compared.

In this embodiment, the compared report in step S614 has a first count value. When the compared bit of the access data is not equal to the compared bit of the verify data, the first count value counts up by 1. Thus, a number representing that the compared bit of the access data is not equal to the compared bit of the verify data can be obtained according to the first count value.

In another embodiment, the compared report has a second count value. When the compared bit of the access data is 0 and the compared bit of the verify data is 1, the second count value counts up by 1. In other embodiments, the compared report has a third count value. When the compared bit of the access data is 1 and the compared bit of the verify data is 0, the third count value counts up by 1.

To determine whether the access action executed by each storage medium is normal, step S615 outputs the compared report. In one embodiment, when receiving a read command, the corresponding storage medium outputs the corresponding compared report.

The compared report is utilized to determine whether each storage medium is normal (step S616). The invention does not limit the method of determining the storage medium. In one embodiment, when the compared report exceeds a pre-determined value, it determines that the storage medium cannot execute the access action normally. When the compared report is less than the pre-determined value, it determines that the storage medium can execute the access action normally.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A storage medium comprising:
    a processing module receiving test data according to a write command;
    a cell array storing the test data, and
    wherein the processing module receives verify data according to a comparison command, reads the test data stored in the cell array to generate access data, and compares the access data with the verify data to generate a compared report,
    wherein the processing module comprises:
    a logic decoder unit decoding the write command to generate a first control signal and decoding the comparison command to generate a second control signal;
    an accessing unit writing the test data into the cell array according to the first control signal and retrieving the test data stored in the cell array according to the second control signal;
    a comparing unit comparing each bit of the access data and each bit of the verify data one by one to generate the compared report; and
    a register unit storing the compared report.

2. The storage medium as claimed in claim 1, wherein the processing module outputs the compared report to a memory controller according to a read command.

3. The storage medium as claimed in claim 1, wherein the register unit comprises a first accumulator comprising a first count value, and when a first bit of the access data is not equal to a first bit of the verify data, the first count value counts up by 1.

4. The storage medium as claimed in claim 3, wherein the register unit further comprises a second accumulator comprising a second count value, and when the first bit of the access data is 0 and the first bit of the verify data is 1, the second count value counts up by 1.

5. The storage medium as claimed in claim 4, wherein the register unit comprises a third accumulator comprising a third count value, and when the first bit of the access data is 1 and the first bit of the verify data is 0, the third count value counts up by 1.

6. A transmittal system comprising:
    a memory controller sending at least one write command and at least one comparison command; and
    a storage medium receiving the write command and the comparison command and comprising:
        a processing module receiving test data according to the write command; and
        a cell array storing the test data,
        wherein the processing module receives verify data according to the comparison command, reads the test data stored in the cell array to generate access data, and compares the access data with the verify data to generate a compared report,
        wherein the processing module comprises:
            a logic decoder unit decoding the write command to generate a first control signal, and decoding the comparison command to generate a second control signal;
            an accessing unit writing the test data into the cell array according to the first control signal and retrieving the test data stored in the cell array according to the second control signal;
            a comparing unit comparing each bit of the access data and each bit of the verify data one by one to generate the compared report; and
            a register unit storing the compared report.

7. The transmittal system as claimed in claim 6, wherein the memory controller alternately sends a plurality of write commands and a plurality of comparison commands.

8. The transmittal system as claimed in claim 6, wherein the memory controller sends a plurality of write commands and a plurality of comparison commands, wherein the write commands are sent first and then the comparison commands are sent.

9. The transmittal system as claimed in claim 6, wherein the memory controller sends at least one read command, and the processing module provides the compared report to the memory controller according to the read command.

10. The transmittal system as claimed in claim 9, wherein when the memory controller sends a plurality of write commands, a plurality of comparison commands and a plurality of read commands, the write commands, the comparison commands, and the read commands are sent alternately.

11. The transmittal system as claimed in claim 6, wherein the register unit comprises a first accumulator comprising a first count value, and when a first bit of the access data is not equal to a first bit of the verify data, the first count value counts up by 1.

12. The transmittal system as claimed in claim 11, wherein the register unit further comprises a second accumulator comprising a second count value, and when the first bit of the access data is 0 and the first bit of the verify data is 1, the second count value counts up by 1.

13. The transmittal system as claimed in claim 12, wherein the register unit comprises a third accumulator comprising a third count value, and when the first bit of the access data is 1 and the first bit of the verify data is 0, the third count value counts up by 1.

14. A control method for a storage medium, comprising:
    storing test data;
    receiving verify data;
    reading stored test data to generate access data;
    comparing the access data and the verify data to generate a compared report;
    outputting the compared report; and
    determining whether the storage medium is normal according to the compared report, wherein when the compared report exceeds a pre-determined value, it is determined that the storage medium is abnormal, and when the compared report is less than the pre-determined value, it is determined that the storage medium is normal.

15. The control method as claimed in claim 14, wherein the compared report has a first count value, and when a first bit of the access data is not equal to a first bit of the verify data, the first count value counts up by 1.

16. The control method as claimed in claim 15, wherein the compared report has a second count value, and when the first bit of the access data is 0 and the first bit of the verify data is 1, the second count value counts up by 1.

17. The control method as claimed in claim 16, wherein the compared report has a third count value, and when the first bit of the access data is 1 and the first bit of the verify data is 0, the third count value counts up by 1.

* * * * *